United States Patent [19]
Singh

[11] Patent Number: 5,973,534
[45] Date of Patent: Oct. 26, 1999

[54] DYNAMIC BIAS CIRCUIT FOR DRIVING LOW VOLTAGE I/O TRANSISTORS

[75] Inventor: Gajendra P. Singh, Sunnyvale, Calif.

[73] Assignee: Sun Microsystems, Inc., Palo Alto, Calif.

[21] Appl. No.: 09/015,360

[22] Filed: Jan. 29, 1998

[51] Int. Cl.⁶ .................................................. H03K 5/08
[52] U.S. Cl. ........................ 327/309; 327/328; 327/389
[58] Field of Search ................................. 327/309, 310, 327/312, 318, 319, 321, 322, 323, 328–333, 379, 384, 389–530, 534, 545, 546

[56] References Cited

U.S. PATENT DOCUMENTS

| | | | |
|---|---|---|---|
| 5,179,297 | 1/1993 | Hsueh et al. ......................... | 307/296.6 |
| 5,444,401 | 8/1995 | Crafts ...................................... | 327/491 |
| 5,504,450 | 4/1996 | McPartland ............................. | 327/437 |
| 5,663,917 | 9/1997 | Oka et al. ................................ | 365/22 |

*Primary Examiner*—Timothy P. Callahan
*Assistant Examiner*—Jeffrey Zweizig
*Attorney, Agent, or Firm*—Townsend and Townsend and Crew

[57] ABSTRACT

A bias circuit that generates a dynamic bias voltage for driving low-voltage transistors in an output buffer that interfaces with high-voltage signals is disclosed. Various circuits have been devised to ensure that no transistor in the bias and the output buffer circuitry undergoes voltages higher than that allowed by the fabrication process, even though the output signal voltage may swing well beyond the tolerable voltage levels. This is accomplished with minimal increase in power consumption and without compromising the speed of operation of the output buffer circuit.

25 Claims, 4 Drawing Sheets

1

DYNAMIC BIAS CIRCUIT FOR DRIVING LOW VOLTAGE I/O TRANSISTORS

BACKGROUND OF THE INVENTION

The present invention relates in general to integrated circuits, and in particular to a bias circuit driving low-voltage transistors used in an output buffer that interfaces with high-voltage signals.

To reduce power consumption there has been a growing trend in various fields of semiconductor technology (including memories, microprocessors, complex programmable logic devices, etc.) toward designing devices that have the core circuitry operating at lower power supply voltages. These circuits, however, still must be able to interface with other circuitry that run at higher voltage levels. For example, the core circuitry for a microprocessor may be designed to operate with a 3.3 volt or a 2.9 volt supply voltage, but the chip must be able to receive and process signals swinging between for example ground and +5 volts. The interface problem has been traditionally solved by level shifting circuitry that translate the voltage at the input/output (I/O) interface from one level to the other.

The voltage differential between the internal power supply levels and the external signal levels, however, has continued to grow as the power supply voltages for core circuitry drop to lower and lower levels. This has posed new challenges to the circuit designer. More specifically, the low voltage circuitry can be fabricated using a low voltage process that places limitations on maximum voltage levels under which a transistor can operate reliably. To prevent I/O transistors from experiencing high voltage stress, it is common to insert cascode transistors in series with the transistors that drive the I/O node. The cascode transistors are then typically biased by a reference voltage to split the total voltage between the several transistors.

This circuit technique works reliably up to a certain voltage differential. For example, with a fixed reference voltage of 1.65 volts biasing the cascode transistors of an output driver that runs off of a 3.3 volt supply, the I/O transistors in a 1.9 volt process still undergo voltage stress given overshoot or undershoot of about 0.8 volts.

There is a need for a bias circuit for dynamically driving low-voltage transistors in an output buffer that interfaces with high voltage signals.

SUMMARY OF THE INVENTION

The present invention provides a bias circuit that generates a dynamic bias voltage for driving low-voltage transistors in an output buffer that interfaces with high-voltage signals. Broadly, the present invention uses various circuit techniques to ensure that no transistor in the bias and the output buffer circuitry undergoes voltages higher than that allowed by the fabrication process, even though the output signal voltage may swing well beyond the tolerable voltage levels. This is accomplished with minimal increase in power consumption and without compromising the speed of operation of the output buffer circuit.

Accordingly, in one embodiment, the present invention provides a biasing circuit for driving output buffer transistors connected to an input/output (I/O) node, including a voltage swing limiting circuit that couples between a first power supply voltage and ground and generates a bias voltage at an output that drives output buffer transistors. The voltage swing limiting circuit dynamically varies the bias voltage in response to a signal on the I/O node.

In one embodiment, the voltage swing limiting circuit includes: a reference voltage circuit coupled to the first power supply voltage that generates first and second reference voltages, a first low power buffer circuit coupling the first reference voltage to the output, and a second low power buffer circuit coupling the second reference voltage to the output, the voltage swing of the bias voltage at the output being limited between the first and the second reference voltages.

In another embodiment, the bias circuit further includes a first clamp circuit for clamping the bias voltage to a first clamp voltage, and a second clamp circuit for clamping the bias voltage to a second clamp voltage, and logic circuitry to enable the first and second clamp circuits when the circuit is in output buffer mode driving the I/O node. The first and second voltage clamp circuit operate to increase the rise and fall time of the output signal.

A better understanding of the nature and advantage of the bias circuit of the present invention may be had with reference to the detailed description and drawings below.

DESCRIPTION OF THE PREFERRED EMBODIMENT

Typical core supply voltages for low power circuits designed up to now may range from 2.5 volts to 2.9 volts. To interface with 3 volt or 5 volt signals, there is still enough margins for conventional I/O circuitry to reliably drive the output signal and receive an input signal without subjecting the I/O transistors to high voltage stress. When the core supply voltage level is reduced to as low as, for example, 1.9 volts and the I/O circuitry uses 1.9 volt transistors, interfacing with signals that swing up to for example 3.3 volts subjects the gate oxide of the I/O transistors to unacceptable levels of voltage stress.

The present invention uses 1.9 volts and 3.3 volts for the lower core supply voltage and the higher external signal levels, respectively, as exemplary values to illustrate the principles of operation of the circuit of the present invention. It is to be understood that these voltage levels are exemplary only and that the solution offered by the circuit of the present invention may be applied when using other voltage conditions that give rise to similar problems.

Figure 1A:
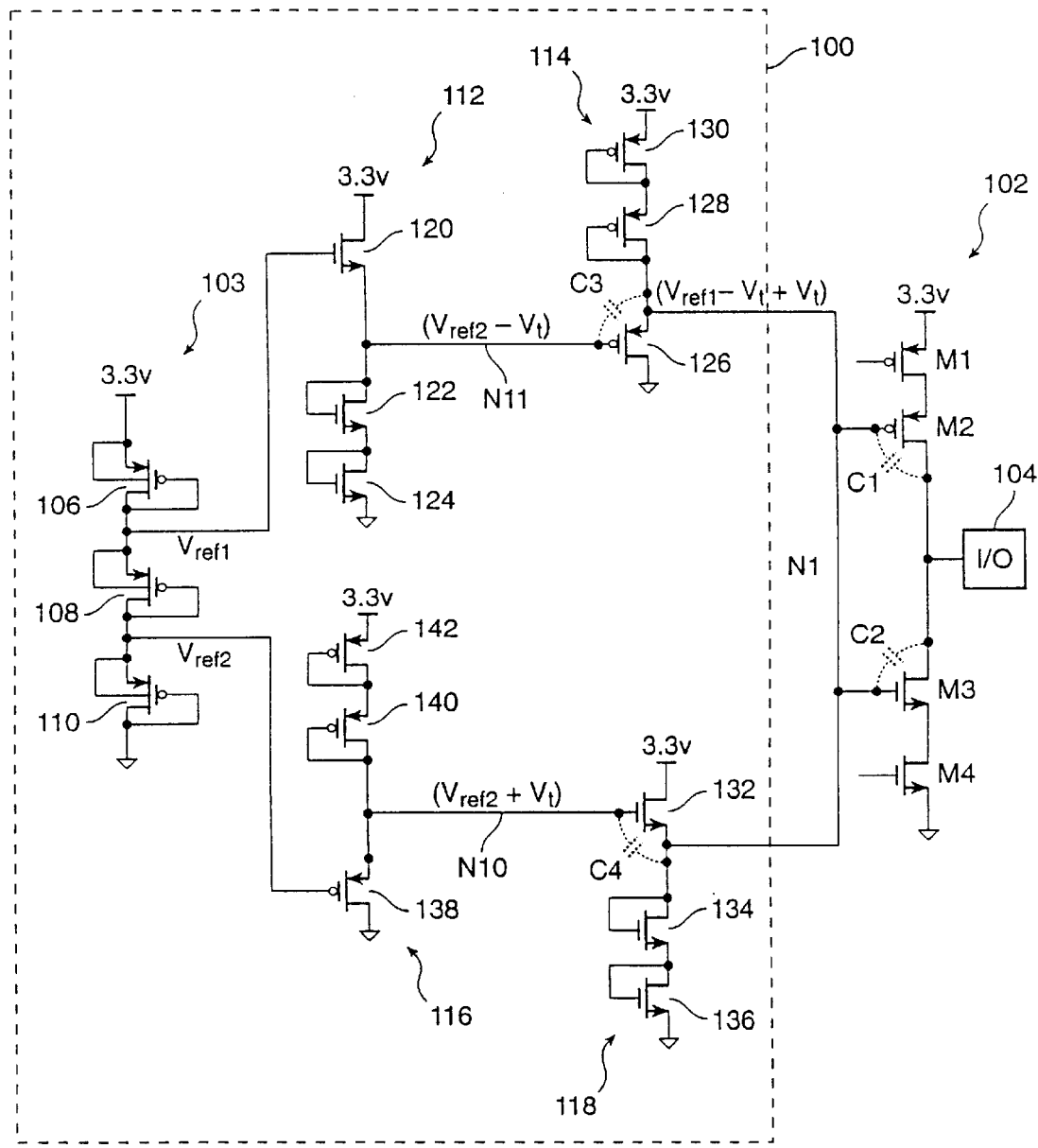
FIG. 1A is a circuit diagram of an exemplary embodiment of the dynamic bias circuit of the present invention.

Referring to FIG. 1A, there is shown an embodiment of the dynamic bias circuit 100 of the present invention. Bias circuit 100 generates a dynamic bias voltage Vbias at node N1 that is connected to the gate terminals of cascode transistors M2 and M3 in the output buffer 102. Output buffer 102 further includes driver transistors M1 and M4 that in response to the signal at their gate terminals drive the I/O node 104. Bias circuit 100 includes a reference voltage generating circuit 103 that generates two reference voltages Vref1 and Vref2 from the larger power supply voltage of 3.3 volts. The embodiment shown in FIG. 1A, uses three diode-connected PMOS transistors 106, 108, and 110 connected between 3.3 volts and ground. By appropriate sizing of the transistor channels, desired reference voltages of, for example, Vref1=2.2 volts and Vref2=1.1 volts are obtained. The PMOS transistors in the divider chain are designed with small dimensions to reduce DC power dissipation, and each have their N-well terminal connected to their respective source terminal to eliminate body effect. Those skilled in this art appreciate that there are methods other than the PMOS voltage divider chain 103 to generate Vref1 and Vref2, including a divider chain using other types of resistive elements.

The two reference voltages set the upper and lower bounds of the bias voltage Vbias at node N1 to be applied to the output buffer cascode transistors M2 and M3. To allow Vbias at node N1 to vary between the two reference voltages, each reference voltage is buffered separately and then applied to node N1. Vref1 is buffered by a first buffer 112 that shifts Vref1 down by one Vt, where Vt is a transistor threshold voltage. To restore the full level of Vref1 at node N1, a second buffer 114 follows buffer 112 and adds one Vt. A similar circuit is provided for Vref2, where this time a third buffer 116 increases Vref1 voltage level by one Vt, and is then followed by a fourth buffer 118 that drops the voltage level by one Vt to restore full Vref2 at node N1.

Buffer circuit 112 includes an NMOS Vt-shift transistor 120 with its drain terminal connected to the 3.3 volt power supply and its gate terminal connected to Vref1. NMOS transistor 120 is biased by a couple of small gate-drain connected NMOS transistors 122 and 124 that connect its source terminal to ground. Buffer circuit 114 includes a PMOS Vt-shift transistor 126 that has its drain terminal connected to ground and its gate terminal connected to the output of buffer circuit 112 (i.e., source terminal of NMOS 120). PMOS transistor 126 is biased by a couple of small gate-drain connected PMOS transistors 128 and 130 that connect its source terminal (i.e., node N1) to the 3.3 volt power supply. Buffers 116 and 118 are similarly constructed as shown in FIG. 1A.

In operation, when the signal at I/O node 104 swings up toward the 3.3 volts supply voltage, parasitic capacitances C1 and C2 of transistors M2 and M3 (shown in phantom in FIG. 1A) couple the signal to node N1. With 2.2 v-Vt at its gate terminal, as N1 rises toward 3.3 volts and reaches 2.2 volts (Vref1), PMOS transistor 126 turns on. This pulls the voltage at node N1 back down toward ground. This action ensures that Vbias at node N1 does not exceed 2.2 volts even if the signal at I/O node 104 overshoots to, for example, 4.1 volts.

In the negative direction, when the signal at I/O node 104 swings down toward ground, the parasitic capacitances C1 and C2 couple the voltage to node N1. This time, with 1.1 v+Vt at its gate terminal, as N1 reaches 1.1 volts (Vref2) NMOS transistor 132 turns on. This pulls the voltage at node N1 back up toward the 3.3 volt power supply. This action ensures that Vbias at node N1 does not fall below 1.1 volts even if the signal at I/O node 104 undershoots to, for example, -0.8 volts.

As can be seen from the operation of bias circuit 100, the larger Vt-shift transistors 120, 126, 132, and 142 turn on only when they are needed to clamp Vbias to its appropriate level. The rest of the time, these transistors are turned off and the DC current is limited to the very small amount dissipated by gate-drain connected load transistors in each buffer circuit.

Thus, the bias voltage Vbias at node N1 moves between 1.1 volts and 2.2 volts depending on the signal at the I/O node. Using the exemplary voltage levels for the power supplies and the reference voltages and an exemplary Vt of about 0.3 volts, an examination of the voltage levels across the various transistors reveals that the circuit of the present invention operates safely in the sense that no transistor is subject to oxide stress, under all I/O conditions. For example, assume that the circuit is in the receive mode where an external signal is being applied to I/O node 104. In receive mode, transistors M1 and M4 are turned off by applying 3.3 volts and ground at their gate terminals, respectively. In case of an overshoot of about 0.8 volts where the I/O signal may reach as high as 4.1 volts, Vbias moves up to and is clamped at 2.2 volts. This places exactly 1.9 volts across M2 and M3 (4.1 v–2.2 v) making sure that neither one experiences oxide stress. When the I/O signal undershoots to for example –0.8 volts, Vbias moves down to and is clamped at 1.1 volts. This again limits the voltage across output transistor M2 and M3 to 1.9 volts, eliminating any danger of oxide stress.

Depending on the sizes of the various transistors in the circuit of FIG. 1A, the voltage at node N1 may not be clamped at the desired voltage levels as stably as the circuit may require. Incursions of the signal beyond the reference levels may be caused by parasitic capacitances C3 and C4 that exist between the source-gate terminals of transistors 126 and 132, respectively. Similar to the effect of parasitic capacitances C1 and C2, parasitic capacitances C3 and C4 couple the signal at I/O node 104 to the gate terminals of transistors 126 and 132. Because the gate-drain connected load circuit in the preceding buffer stages 112 and 116 are small and thus weak, they present little resistance to the signal at the gate terminals of transistors 126 and 132 moving in the opposite direction. Thus, node N1 may in fact rise above 2.2 volts or below 1.1 volts because of the failure of transistors 126 and 132 to turn on in time.

Figure 1B:
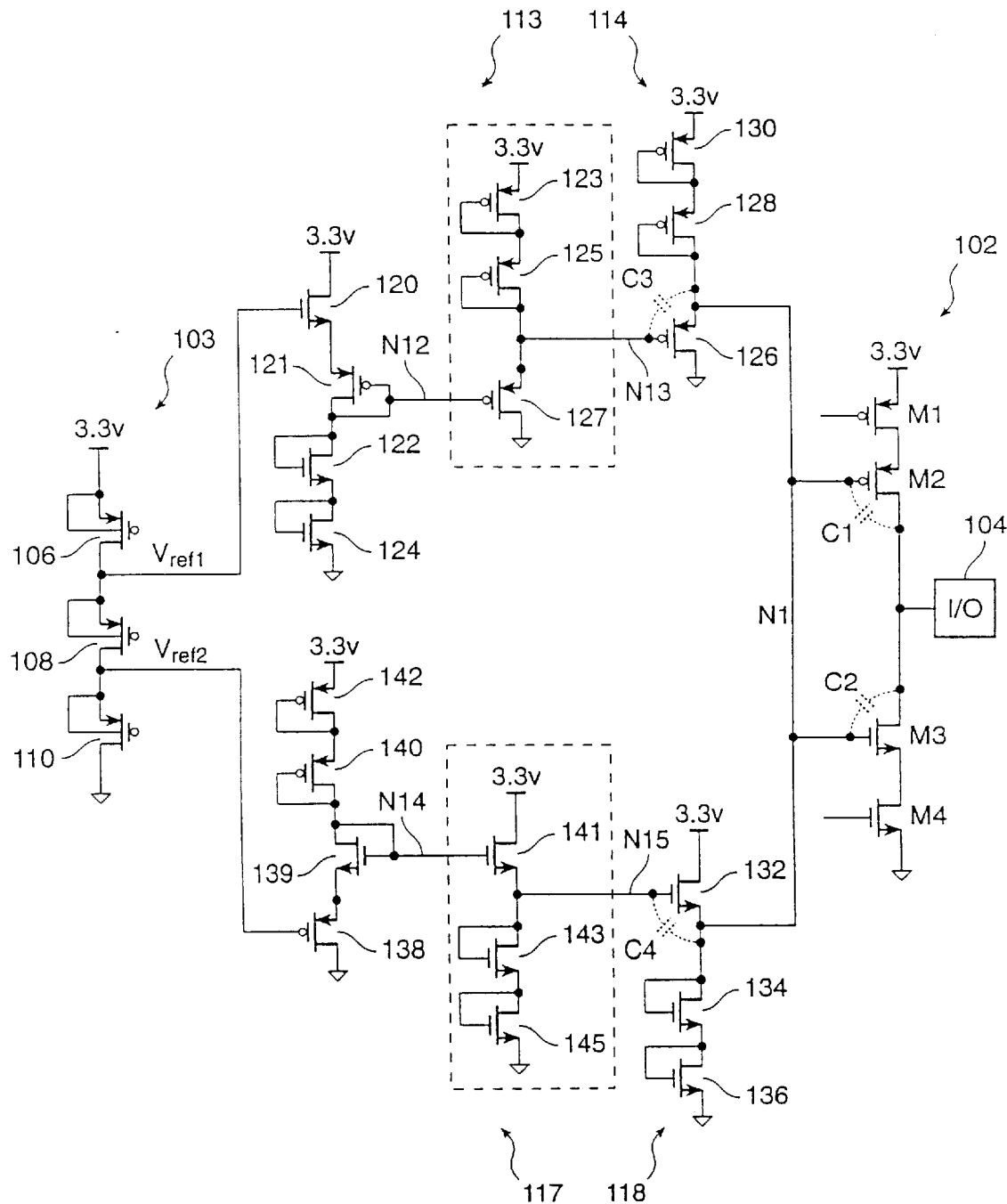
FIG. 1B is a circuit diagram showing an improvement to the embodiment of FIG. 1.

An improvement to the circuit of FIG. 1A that addresses this condition is shown in FIG. 1B. Identical elements in all figures herein are referred to by the same reference numerals. To provide for a strong pull-down clamp device for the 2.2 volts bias voltage, and a strong pull-up clamp device for the 1.1 volt bias voltage, another buffer stage has been added to each path. This has been accomplished by inserting a second Vt-shift transistor in the first stage to set up the condition for the addition of a third Vt-shift buffer stage. Referring to the Vref1 path, the first buffer stage has been modified to include a Vt(120) shift plus a second Vt(121) shift to generate Vref1–2 Vt at node N12. An additional buffer stage 113, identical in its make up to that of stage 114, connects between the first and the final stage 114. Thus, the voltage level at node N13 equals (Vref1–2 Vt)+Vt=Vref1-Vt. Final buffer stage 114 then adds the last Vt(126) to restore a full Vref1 (2.2 volts) at node N1. Now, a strong PMOS transistor 127 coupling the gate terminal of PMOS 126 to ground does not allow the parasitic capacitance C3 to pull node N13 up beyond 2.2 volts as the output signal moves up. By the operation of this circuit, therefore, Vbias is stably clamped at 2.2 volts.

The circuitry in the Vref2 path operates similar to the Vref1 path. Vref1 is shifted up by two Vt (138 and 139) at node N14, then shifted down one Vt (141) by buffer stage 117 and another Vt (132) by buffer stage 118 to clamp Vbias at 1.1 volts. NMOS transistor 141 provides a strong pull-up device at node N15 to counteract any coupling by C4 in the negative direction. Thus, this circuit generates a very stable window within which Vbias is dynamically varied.

The Vt shift transistors in the various buffer stages do not have their well terminals connected to their source terminals to eliminate the body effect. However, the circuit operates such that threshold voltage variations in the various Vt shift transistors inherently offset each other. Moreover, any remaining variations can be corrected by fine tuning the voltage levels of Vref1 and Vref2. Any differences between the Vt values for the PMOS and NMOS transistors can be similarly corrected by adjusting the Vref levels.

When the circuit operates in drive mode, the gate terminal of output transistor M1 moves between 1.4 volts to 3.3 volts, and the gate terminal of output transistor M4 moves between ground and 1.9 volts. In response to that, transistors M1 and M4 turn on and off to drive I/O node 104 up to 3.3 volts or down to ground. Bias circuit 100 operates in a similar fashion as in the receive mode to protect all transistors from high voltage stress. However, in drive mode, the tracking by Vbias of the output signal slows down output driver 102 somewhat. This is due to the fact that as the output voltage starts to move, for example, from 3.3 volts down toward ground, transistor M3 is initially strongly driven by a 2.2 volt Vbias. But, Vbias starts to move down with the output signal reducing the gate voltage for M3 and thus slowing down the falling transition. Similarly, when the output signal moves from ground to 3.3 volts, the drive for transistor M2 reduces as Vbias moves up from 1.1 volts to 2.2 volts.

Figure 2:
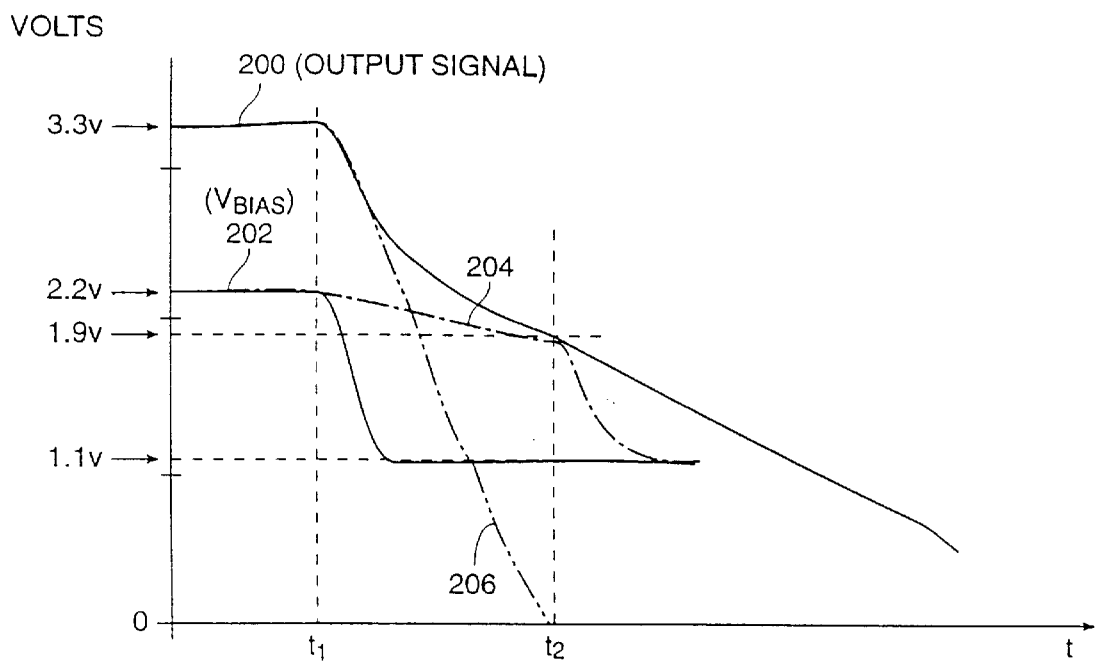
FIG. 2 is a timing diagram showing the operation of the circuit of the present invention.

The impact of the operation of bias circuit 100 on the speed of output buffer 102 is shown by the timing diagram of FIG. 2. Referring to FIG. 2, there is shown waveforms for the output signal and Vbias over time as the output signal transitions from 3.3 volts to ground. The output signal as shown by waveform 200 starts at 3.3 volts and begins to fall at time t1 in response to the signals driving transistors M1 and M4. Vbias as shown by waveform 202 starts at 2.2 volts and tracks the output signal 200 by moving down toward 1.1 volts at time t1. As shown by the solid waveform 200, the falling transition of the output signal starts to slow down appreciably as Vbias reduces in voltage reduces the drive for transistor M3.

The present invention, however, recognizes that Vbias need not be reduced to 1.1 volts unless and until there is an undershoot at I/O node 104. In fact, up until the moment when the output signal reaches ground, Vbias can safely remain as high as 1.9 volts providing a healthy drive for transistor M3. The present invention provides clamp circuitry to hold Vbias at 1.9 volts during the time the output signal moves from 3.3 volts to 0 volts. The clamp circuitry is then disabled to allow Vbias to drop all the way down to 1.1 volts to protect transistor M3 from oxide stress.

Figure 3:
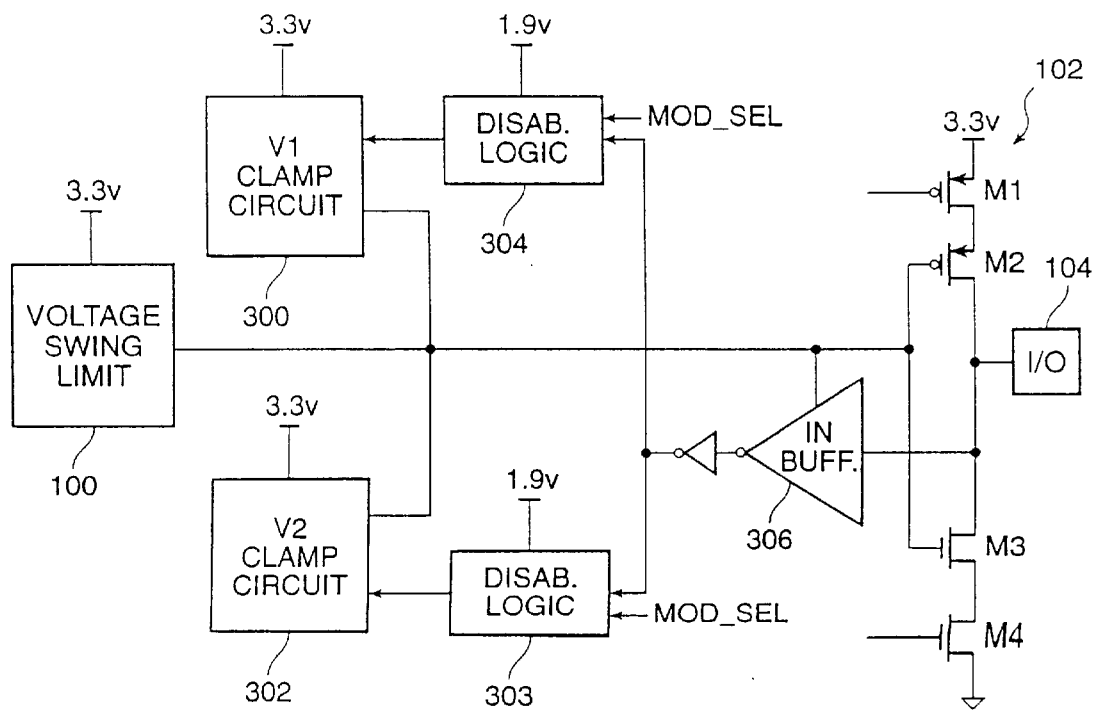
FIG. 3 is a block diagram of another embodiment of the present invention with speed enhancement circuitry.

Referring to FIG. 3 there is shown a block diagram of the embodiment of the present invention that includes the clamp circuitry to enhance the speed of operation of the output buffer circuit in drive mode. A first clamp circuit 300 runs off of the 3.3 volt power supply voltage and has its output coupled to node N1 to clamp Vbias to first voltage V1. A second clamp circuit 302 also runs off of the 3.3 volt power supply voltage and has its output coupled to node N1 to clamp Vbias to second voltage V2. Given the exemplary voltage levels discussed above, the voltage levels for V1 and V2 would preferably be 1.9 volts and 1.4 volts, respectively.

To make sure that clamp circuits 300 and 302 clamp Vbias only when needed (i.e., in drive mode and only when not experiencing overshoot or undershoot), disable logic blocks 303 and 304 that run off of the internal 1.9 volt power supply voltage control clamp circuits 302 and 300, respectively. Disable logic blocks 303 and 304 receive the logic level at I/O pin 104 and a mode select MOD_SEL signal to control the operation of the clamp circuits in response to these signals. Because disable logic blocks 303 and 304 run off of the internal 1.9 volt supply voltage, the transistors implementing the logic must be protected from large voltage swings at the I/O node. A specially designed input buffer 306 ensures that the I/O signal is translated to acceptable voltage levels before it is applied to disable logic blocks 303 and 304. The operation of the clamp circuits and disable logic blocks will be described hereinafter in greater detail in connection with FIG. 4.

Figure 4:
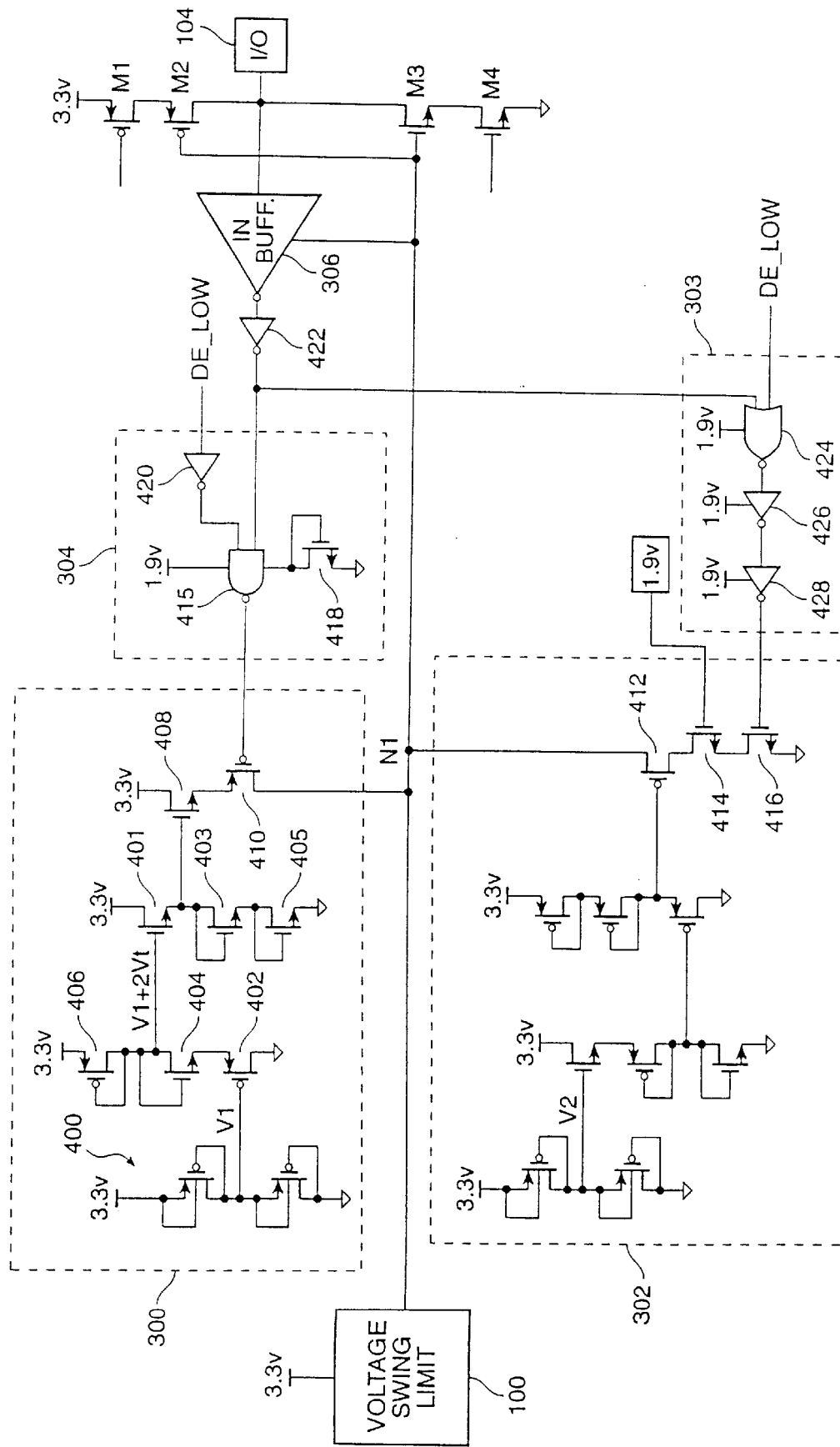
FIG. 4 shows the circuitry of the block diagram of FIG. 3 in greater detail with an exemplary transistor level implementation.

Referring to FIG. 4, there is shown an exemplary transistor-level implementation of clamp circuits 300, 302 and disable logic blocks 303 and 304. Clamp circuit 300 includes a voltage divider circuit 400 to generate a first clamp voltage V1 of, for example, about 1.9 volts. First clamp voltage V1 is applied to a first buffer stage that shifts V1 up by two Vt (402 and 404) similar to the first buffer stage of FIG. 1B. A variation of the first buffering stage is shown in FIG. 4 where instead of a serial pair of gate-drain connected load transistors, only a single small gate-drain connected PMOS transistors 406 is used. To restore the full 1.9 volt clamp voltage, two down Vt shift (401 and 408) buffer stages follow. The fully restored V1 level is then coupled to node N1 via a switch PMOS transistor 410. Clamp circuit 302 is similarly constructed, except the second clamp voltage V2 is set at about 1.4 volts and the polarities of the transistors in the level shift stages are reversed. Clamp circuit 302 is also different in the way it connects to node N1. The final stage of circuit 302 includes a PMOS Vt shift transistor 412 that connects to ground via two NMOS transistors 414 and 416. NMOS transistor 416 acts as a switch transistor.

Clamp circuits 300 and 302 operate much like the circuitry inside voltage swing limiting circuit 100 as described above in connection with FIGS. 1A and 1B. A difference is the inclusion of switch transistors 410 and 416 that connect or disconnect the reference voltages V1 and V2 from node N1. These switch transistors are controlled by disable logic blocks 304 and 303. As shown in FIG. 4, disable logic 304 includes a NAND gate 415 that connects between the 1.9 volt internal power supply and ground via a gate-drain connected NMOS transistor 418. The insertion of NMOS transistor 418 ensures that when a low logic level is to be transmitted at the output of NAND gate 415, it is shifted up by one Vt as opposed to being at ground. The shifting up of the output of NAND gate 415 by a Vt (about 0.3 volts) protects PMOS transistors 410 against over voltage conditions when Vbias at node N1 is at 2.2 volts.

One input of NAND gate 415 connects to the output of an inverter 420 that receives an active low output enable signal OE_LOW at its input. This signal corresponds to the MODE_SEL signal of FIG. 3. The other input of NAND gate 415 connects to the output of inverter 422 that receives the buffered I/O signal at its input. The buffering of the I/O signal is performed by input buffer 306 which is an inverting buffer. Input buffer 306 must translate a larger voltage swing at the I/O node to safe levels for low-voltage transistors, while reliably detecting the logic levels of the I/O signal. A preferred embodiment for input buffer 306 is described in detail in copending and commonly-assigned patent application number 09/015,847 (Atty. Docket No. 016747-0078/P2329), entitled "High Voltage Input Buffer Circuit Using Low Voltage Transistors," which is hereby incorporated by reference in its entirety.

Disable logic block 304 thus operates to turn on switch transistor 410 and keep it on for as long as the circuit is driving I/O node 104 (OE_LOW is at logic low level indicating a drive mode rather than a receive mode), and input buffer 306 detects a logic high level at I/O node 104. Switch transistor 410 is turned off as soon as input buffer 306 detects a logic low level at I/O node 104. Therefore, when the circuit is driving the output node from a high level to a low level, initially PMOS 410 is on clamping Vbias to 1.9 volts. Once input buffer 306 detects a logic low level (when there is a possibility of undershoot), disable logic 304 turns PMOS transistor 410 off, allowing Vbias to drop all the way down to 1.1 volts (by the operation of voltage swing limiting circuit 100). This protects transistors M2 and M3 from over voltage conditions in case of an undershoot.

Disable logic block 303 includes a NOR gate 424 that receives OE_LOW at one input and the output of the inverter 422 at another input. The output of NOR gate 424 drives the gate terminal of NMOS switch transistor 416 after going through a couple of inverters 426 and 428 that add a slight delay. Accordingly, NMOS switch transistor 416 is turned on and stays on as long as OE_LOW is low (i.e., drive mode rather than receive mode), and input buffer 306 detects a logic low level at I/O node 104. Switch transistor 416 is turned off as soon as input buffer 306 detects a logic high level at I/O node 104. Therefore, when the circuit is driving the output node from a low level to a high level, initially NMOS transistor 416 is on allowing PMOS transistor 412 to clamp Vbias at V2=1.4 volts. Once input buffer 306 detects a logic high level (when there is possibility of overshoot), disable logic 303 turns NMOS switch transistor 416 off, disconnecting the current path between PMOS 412 and ground. This allows Vbias at node N1 to rise quickly to 2.2 volts by the operation of voltage swing limiting circuit 100. The gate terminal of NMOS transistor 414 is driven preferably by a 1.9 volt safe reference voltage generator circuit an embodiment of which is described in detail in commonly assigned, copending application Ser. No. 09/014, 890, entitled "Bias Generator Circuit for Low Voltage Applications," which is hereby incorporated by reference in its entirety.

The impact of this circuit on the operational speed of output buffer 102 is diagrammatically shown in FIG. 2 for the falling transition. As shown by the broken line 204, at time t1, Vbias at node N1 starts to decrease but not at the same rate as the I/O signal. Vbias, instead drops slightly down to 1.9 volts (the first clamp voltage) and stays at that level until the I/O signal shown by broken line 206 reaches ground at time t2. At this time (t2), input buffer 306 detects a logic low level and disconnects clamp circuit 300 releasing Vbias to drop all the way down to 1.1 volts. This protects transistors M2 and M3 against undershoot at the output.

In conclusion, the present invention provides a bias circuit that generates a dynamic bias voltage for driving low-voltage transistors in an output buffer that interfaces with high-voltage signals. Various circuits have been devised to ensure that no transistor in the bias and the output buffer circuitry undergoes voltages higher than that allowed by the fabrication process, even though the output signal voltage may swing well beyond the tolerable voltage levels. This is accomplished with minimal increase in power consumption and without compromising the speed of operation of the output buffer circuit. While the above describes exemplary embodiments of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A biasing circuit for driving a bias terminal of output buffer transistors that couple to an output node, comprising:
    a voltage swing limiting circuit coupled between a first power supply voltage and ground and having an output terminal coupled to the bias terminal,
    wherein, said voltage swing limiting circuit generates at its output terminal a bias signal whose voltage level varies dynamically between a first voltage and a second voltage in response to a signal on the output node.

2. The biasing circuit of claim 1 wherein said voltage swing limiting circuit comprises:
    a reference voltage generator coupled to said first power supply voltage and generating first and second reference voltages;
    a first buffer circuit coupling said first reference voltage to said output terminal of said voltage swing limiting circuit; and
    a second buffer circuit coupling said second reference voltage to said output terminal of said voltage swing limiting circuit,
    wherein, a voltage swing of said bias signal is limited between said first and said second reference voltages.

3. The biasing circuit of claim 2 wherein each one of said first and second buffer circuits comprises:
    a first level shift stage having an input coupled to a respective reference voltage, said first level shift stage shifting a voltage level of said respective reference voltage by one transistor threshold voltage; and
    a second level shift stage having an input coupled to an output of said first level shift stage, said second level shift stage shifting a voltage level at said output of said first level shift stage by one transistor threshold voltage to restore a voltage level of said reference voltage at an output.

4. The biasing circuit of claim 3 wherein said reference voltage generator comprises a plurality of transistors coupled in a voltage divider chain.

5. The biasing circuit of claim 2 wherein each one of said first and second buffer circuits comprises:
    a first level shift stage having an input coupled to a respective reference voltage, said first level shift stage shifting a voltage level of said respective reference voltage by two threshold voltages;
    a second level shift stage having an input coupled to an output of said first level shift stage, said second level shift stage shifting a voltage level at said output of said first level shift stage by one threshold voltage in the opposite direction; and
    a third level shift stage having an input coupled to an output of said second level shift stage, said third level shift stage shifting a voltage level at said output of said second level shift stage by one threshold voltage in the opposite direction to restore a voltage level of said reference voltage at an output.

6. The biasing circuit of claim 2 further comprising:
    a first clamp circuit having an output coupled to the bias terminal, said first clamp circuit clamping said bias signal to a first clamp voltage when selected;
    a second clamp circuit having an output coupled to the bias terminal, said second clamp circuit clamping said bias signal to a second clamp voltage when selected; and
    logic circuitry having an output coupled to said first and second clamp circuits, said logic circuitry selecting said first and second clamp circuits in a first mode of operation.

7. The biasing circuit of claim 6 wherein each one of said first and second clamp circuits comprises:
- a second reference voltage generator generating said first clamp voltage at an output;
- a buffer circuit having an input coupled to said output of said second reference voltage generator; and
- a switch transistor coupling an output of said buffer circuit to said bias terminal.

8. The biasing circuit of claim 7 wherein said logic circuitry couples between ground and a second power supply voltage that is lower in voltage than said first power supply voltage, said logic circuitry further has a first input coupled to a mode select signal, and a second input coupled to a signal received from the output node via an input buffer circuit.

9. The biasing circuit of claim 8 wherein said logic circuitry comprises a circuit for performing a NAND function, said circuit for performing a NAND function comprises a level shift transistor for shifting a logic low output of said circuit for performing a NAND function by one threshold voltage.

10. The biasing circuit of claim 9 wherein said logic circuitry further comprises:
- a first inverter coupled between said second power supply and ground, and coupling said mode select signal to said first input; and
- a second inverter coupled between said second power supply voltage and ground, and coupling said signal received from the output node to said second input.

11. A method for biasing cascoade transistors in an output buffer, comprising the steps of:
- increasing a voltage level at a gate terminal of the cascode transistors to a first bias voltage when a signal at an output of the output buffer rises up toward a logic high level; and
- decreasing a voltage level at said gate terminal of the cascode transistors to a second bias voltage less than said first bias voltage, when said signal drops down toward a logic low level,
- wherein, the maximum voltage drop across the cascode transistors is limited to predetermined voltage during the rise and fall of the signal.

12. The method of claim 11 wherein said step of increasing a voltage level comprises the steps of:
- feeding back said signal to said gate terminal of the cascode transistors; and
- clamping a voltage level at said gate terminal to said first bias voltage as said rises above said first bias voltage.

13. The method of claim 11 wherein said step of decreasing a voltage level comprises the steps of:
- feeding back said signal to said gate terminal of the cascode transistors; and
- clamping a voltage level at said gate terminal to said second bias voltage as said signal falls below said second bias voltage.

14. The method of claim 11 further comprising the steps of:
- allowing said voltage level at said gate terminal of the cascode transistors to drop down from said first bias voltage to a first clamp voltage greater than said second bias voltage, when said signal transitions from a logic high level toward a logic low level; and
- removing said first clamp voltage to allow said voltage level at said gate terminal of the cascode transistors to drop down to said second bias voltage when said signal undershoots.

15. The method of claim 14 further comprising the steps of:
- allowing said voltage level at said gate terminal of the cascode transistors to rise up from said second bias voltage to a second clamp voltage less than said first bias voltage, when said signal transitions from a logic low level toward a logic high level; and
- removing said second clamp voltage to allow said voltage level at said gate terminal of the cascode transistors to rise up to said first bias voltage when said signal overshoots.

16. An output buffer circuit comprising:
- a first pull-up transistor coupled between an output node and a first intermediate node, and having a gate terminal coupled to receive a dynamic bias voltage;
- a second pull-up transistor coupled between the first intermediate node and a first power supply node, and having a gate terminal driven by internal logic;
- a first pull-down transistor coupled between the output node and a second intermediate node, and having a gate terminal coupled to receive the dynamic bias voltage;
- a second pull-down transistor coupled between the second intermediate node and a second power supply node, and having a gate terminal driven by internal logic; and
- a dynamic biasing circuit coupled between the first and second power supply nodes, and having an output coupled to gate terminals of the first pull-up transistor and the first pull-down transistor,
- wherein, the dynamic biasing circuit generates the dynamic bias voltage at its output whose voltage level varies dynamically in response to a signal at the output node.

17. The output buffer circuit of claim 16 wherein the dynamic biasing circuit comprises:
- a first buffer configured to clamp the dynamic bias voltage to a first voltage level when the signal at the output node rises toward a voltage level on the first power supply node; and
- a second buffer configured to clamp the dynamic bias voltage to a second voltage level when the signal at the output node falls toward a voltage level on the second power supply node.

18. The output buffer circuit of claim 17 wherein the first power supply node carries positive power supply voltage, and the second power supply node is ground.

19. The output buffer circuit of claim 17 wherein the first and the second buffers operate in response to the signal at the output node as fed back by a capacitance.

20. The output buffer circuit of claim 19 wherein the capacitance comprises gate-to-drain capacitance of the first pull-up transistor and the first pull-down transistor.

21. The output buffer circuit of claim 19 wherein the dynamic biasing circuit further comprises a reference voltage generator coupled between the positive power supply and ground, and configured to generate the first voltage level and the second voltage level.

22. The output buffer circuit of claim 21 wherein each of the first and second buffers comprises a first threshold voltage (Vt) shift circuit followed by a second Vt shift circuit.

23. The output buffer circuit of claim 22 wherein the first Vt shift circuit and the second Vt shift circuit shift in opposite directions.

24. The output buffer circuit of claim 23 wherein the first Vt shift circuit in the first buffer comprises an n-channel type field effect transistor, and the second Vt shift circuit comprises a p-channel type field effect transistor.

25. The output buffer circuit of claim 24 wherein the first Vt shift circuit in the second buffer comprises a p-channel type field effect transistor, and the second Vt shift circuit comprises an n-channel type field effect transistor.

* * * * *

UNITED STATES PATENT AND TRADEMARK OFFICE
CERTIFICATE OF CORRECTION

PATENT NO.   : 5,973,534
DATED        : October 26, 1999
INVENTOR(S)  : Gajendra P. Singh It is certified that error appears in the above-identified patent and that said Letters Patent is hereby corrected as shown below:

In column 9 at line 49, before "rises" insert --signal--.
In column 9 at line 30, delete "cascoade" and insert therefor --cascode--.

On the title page, under [56] References Cited add the following:

--OTHER PUBLICATIONS
Connor et al., "Dynamic Dielectric Protection for I/O Circuits Fabricated in a 2.5V CMOS Technology Interfacing a 3.3V LVTTL Bus, " *1997 Symposium on VLSI Circuits Digest of Technical Papers*, pp. 119-120.--.

Signed and Sealed this

Second Day of January, 2001

*Attest:*

Q. TODD DICKINSON

*Attesting Officer*      *Commissioner of Patents and Trademarks*